United States Patent
Humes et al.

(10) Patent No.: US 6,766,154 B2
(45) Date of Patent: Jul. 20, 2004

(54) FAST SETTLING FINE STEPPING PHASE LOCKED LOOPS

(75) Inventors: Todd E. Humes, Shoreline, WA (US); Kenneth K. Tsai, Rancho Palos Verdes, CA (US); Talley J. Allen, Torrance, CA (US); Mark Kintis, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 686 days.

(21) Appl. No.: 09/800,699

(22) Filed: Mar. 7, 2001

(65) Prior Publication Data

US 2002/0127988 A1 Sep. 12, 2002

(51) Int. Cl.[7] .................................................. H04B 7/00
(52) U.S. Cl. ...................... 455/260; 455/258; 455/259; 455/265; 455/266; 331/17; 331/25
(58) Field of Search ................................. 455/260, 259, 455/261, 258, 264, 265, 263, 266, 255; 331/17, 25, 196, 8, 18, DIG. 2; 360/91

(56) References Cited

U.S. PATENT DOCUMENTS

| | | | | |
|---|---|---|---|---|
| 5,091,702 A | * | 2/1992 | Foell | ............................. 331/4 |
| 5,402,425 A | * | 3/1995 | Bladh | .......................... 370/518 |
| 5,686,866 A | * | 11/1997 | Badger | .......................... 331/17 |
| 6,064,273 A | | 5/2000 | Donohue | |
| 6,611,176 B1 | * | 8/2003 | Goldman | ...................... 331/17 |

* cited by examiner

Primary Examiner—Pablo N. Tran
(74) Attorney, Agent, or Firm—Ronald M. Goldman

(57) ABSTRACT

Fast switching and fast settling is achieved in a phase locked loop ("PLL") containing a bandwidth switched active loop filter (8) by feeding the phase error signal of the phase detector (1) of the PLL to the non-inverting input of the amplifier (7) within the loop filter and having the electronic switch (17) control the loop filter bandwidth through changing the resistance (9, 11) to ground at the inverting input of the amplifier between a high and low value associated respectively with broad bandwidth and narrow bandwidth to the loop filter. Switching is possible in as little as one microsecond, and is accompanied by fast settling of the loop with minimal generation of phase/frequency perturbation. The foregoing PLL is of particular benefit in fast switching frequency synthesizers, such as used in frequency hopping frequency synthesizers of frequency and time division multiplexing systems.

14 Claims, 2 Drawing Sheets

FAST SETTLING FINE STEPPING PHASE LOCKED LOOPS

FIELD OF THE INVENTION

This invention relates to phase locked loops circuits, and, more particularly, to an improved active loop filter for a bandwidth switchable phase locked loop that is fast switching and fast settling with minimal electronic noise.

BACKGROUND

A phase-locked loop ("PLL") is an electronic circuit that incorporates a feedback arrangement to maintain an output signal in a specific relationship with a reference signal. Phase locked loops are used in many kinds of electronics devices to control the frequency and/or phase of a signal. Devices applications for the PLL include tone decoders, demodulators of AM and FM signals, frequency multipliers, frequency synthesizer, pulse synchronizers of signals from noisy sources and regenerators of clean signals.

Typically, a phase locked-loop includes a phase detector, a loop filter and a voltage controlled oscillator ("VCO"). The phase detector compares two input frequencies, generating an output, the phase error signal, that is a measure of the phase difference between those frequencies. If the frequencies differ, the phase error signal is a periodic output at the difference frequency. In the PLL, a reference signal is applied to an input of a phase detector and the output of the VCO is fed back to another input of that phase detector, the feedback arrangement. The phase detector produces a phase error signal that represents the phase (or frequency) difference between the reference signal and the VCO output. After being filtered (and, optionally, amplified) in the loop filter, the filtered (and/or filtered and amplified phase error signal) is applied to the control input of the VCO as a control signal. The control signal causes the frequency of the VCO to deviate in the direction of the reference signal, little by little, while the PLL is settling. When the conditions are right, the VCO quickly shifts in frequency to "lock" on to the reference signal, maintaining a fixed phase with that reference signal. If the frequency of the reference signal is quickly changed in frequency, the foregoing procedure repeats until the PLL again locks to the reference signal.

A typical PLL has three operational modes: a free running mode, in which the reference signal is absent; a capture or acquisition mode in which an output signal from the VCO is different from the reference input signal and the VCO is in the process of continuously changing a phase of its output signal until the output signal maintains the same phase as the reference input signal; and a locked mode, in which the VCO output signal tracks and varies exactly with the phase of the reference input signal.

The speed at which the PLL attains the locked state depends in great part on the bandwidth of the loop filter. A loop filter that has a wide bandwidth is preferred for the capture or acquisition mode because with that filter the PLL has a faster acquisition time. That is, the PLL attains a steady state very quickly. That property is desirable in applications in which the PLL must be switched from one frequency of operation to another very rapidly, such as, as example, in a frequency and time division multiplexing system in which frequencies are stepped at intervals from one frequency to another. A drawback to the wide bandwidth is that wide bandwidth is accompanied by relatively high levels of electronic noise, such as jitter. A loop filter that has a narrow bandwidth is preferred for the locked mode of operation. The narrow bandwidth minimizes the generation of electronic noise, although with that filter the PLL tunes or locks to the reference frequency relatively slowly.

Others have recognized that it is possible to optimize the operation of a PLL by employing a loop filter with a bandwidth that can be changed, a switchable bandwidth. By switching the characteristic of the loop filter between a broad bandwidth and a narrow bandwidth as needed, the benefits of both bandwidths is achieved in the PLL. In a U.S. patent to Donohue, U.S. Pat. No. 6,064,273 (the '273 patent) a band pass filter circuit is described which incorporates a PLL. The PLL contains a loop filter that is of broad bandwidth during the acquisition mode of the PLL and is of narrow bandwidth during the locked mode. The change in characteristic is accomplished, for one, with a pair of oppositely poled diodes placed across a resistance in the loop filter. During the acquisition mode, depending on the polarity of the voltage, one of the diodes conducts and shunts the resistance, the effect of which is to produce a wide bandwidth for the loop filter. When the voltage across the diode drops below a defined level, which occurs after the PLL locks to the reference frequency, the diode no longer shunts the resistance. With the added resistance in the loop circuit, the loop circuit becomes narrower in bandwidth.

Although the loop filter in the PLL of the '273 patent is switchable, the switching time is not controlled. To switch between broad bandwidth and narrow bandwidth in the active loop filter of a PLL and maintain the switching time thereof to a minimum, the traditional approach has been to use two electronic switches, operated simultaneously, in an inverting loop filter arrangement. One electronic switch (RS), when operated to closed condition, raises the gain of the loop filter; and the second electronic switch (RF), when operated to closed condition, maintains the damping of the loop circuit.

The active loop filter of the foregoing PLL included an operational amplifier with the output of the amplifier serving as the output of the filter. The feedback network for the amplifier consists of a resistor and capacitor connected in series between the inverting (−) input and the output of the foregoing amplifier. The output of the phase detector was connected in series with a second resistor to the inverting input and the non-inverting (+) input was grounded.

The foregoing PLL is satisfactory and satisfies the requirements of many applications. Unfortunately, it inherently produces a higher level of phase/frequency perturbation, and, hence, is not satisfactory for some applications, such as the frequency synthesizer for a cell phone multiplexing system next described.

One application in which fast bandwidth switching and low electronic noise is required is found in cellular telephone systems. In one such cellular system a base station controls a large number of different active cell phones to enable cell phone voice and/or data traffic to be carried in the telephone system simultaneously. Briefly speaking, such simultaneous cell phone transmissions are made possible through use of a frequency and time division multiplexing system employed at the base station. The base station equipment assigns each active cell phone a specific carrier frequency. Using a frequency synthesizer, the base station multiplexing equipment then produces each of those assigned carrier frequencies individually in serial order for a very short interval, allowing the modulated carrier frequency signal from each cell phone to pass momentarily through transmission circuits into the base station equipment. The multiplexing system repeats the foregoing frequency switching periodically between frequencies at a very high rate, so high that the interruptions (eg. Divisions) are not discernable by the users of the cell phones. Typically, the frequency synthesizer in the foregoing multiplex system is required to frequency "hop" or "step" between the individual carrier frequencies in a time of about one to ten microseconds.

Not only must the foregoing frequency synthesizer change frequency almost instantaneously, the synthesizer must do so without generating significant phase/frequency perturbation as would cause interference with the telephone traffic. As one appreciates, abrupt changes in an electronic circuit typically produces spurious or transient signals until the electronic circuit recovers from the change. That is, the synthesizer must be "fast settling". Such fast settling synthesizers have been implemented to date in the cell phone multiplexing system using a "ping-pong" architecture in which two PLLs are operated simultaneously and an RF switch is used to select the PLL with the desired frequency. Each of the two PLLs is of a narrow bandwidth, and, hence, produces minimum spurious responses and phase noise. Fast settling time is achieved by tuning the second PLL to the next desired frequency during the interval when data is being transmitted or received using the frequency of the first PLL. The RF switch then rapidly changes to the second PLL, which by that time has stabilized and locked to the new frequency. As earlier discussed, a narrow band characteristic in the PLL is accompanied by slowness in tuning to a new frequency and also by low noise, whereas a wide band characteristic is accompanied by high speed in tuning and by high noise. By using two frequency synthesizers and the RF switch in the foregoing ping-pong architecture, the rapid tuning and low noise characteristic desired in the cell phone system has been achieved.

As one appreciates, the cost and complexity of the foregoing multiplexing system would be reduced were it possible to employ a single PLL that satisfied the foregoing requirements of the cell phone system, such as by a switchable bandwidth PLL. But, to the present that has not been possible of achievement by the switchable bandwidth PLL earlier described. As an advantage, the present invention provides a single switchable bandwidth PLL that satisfies the foregoing requirements.

Accordingly, an object of the invention is to enable bandwidth switching of a non-inverting loop filter.

Another object of the invention is to enable fast switching and settling of a phase locked loop with minimal generation of phase/frequency perturbation.

Another object of the invention is to minimize occurrence of charge injection by the electronic switch of the phase locked loop circuit, which switches the bandwidth characteristic of a loop filter from narrow bandwidth to broad bandwidth for an interval and/or minimize the effect of that charge injection.

SUMMARY OF THE INVENTION

In accordance with the foregoing objects and advantages, the present invention provides a phase locked loop that is fast switching, is fast settling, and produces minimal electronic noise and minimal phase/frequency perturbation. The active loop filter for the phase locked loop includes an operational amplifier with the inverting input connected through a resistance to ground and a resistor capacitor serially connected between the inverting input and the amplifier output. The phase error voltage produced by the phase detector of the phase locked loop is coupled to the non-inverting input of the operational amplifier. That resistance to ground is electronically switchable in resistance level with a single electronic switch, the function of which is to change the bandwidth of the loop filter while maintaining the same damping factor. The output of the foregoing loop filter is adapted for connection to the control input of the voltage controlled oscillator of the phase locked loop.

As an advantage, by requiring only a single electronic switch for effective bandwidth switching a number of sources of charge injection and the accompanying noise inducing injected charges are eliminated. As a further advantage by electronically switching resistance levels at the inverting input of the operational amplifier, an additional source of charge injection inherent in the electronic switch is also eliminated. Thus fast band width switching of a loop filter is retained while the phase/frequency perturbation associated with the charge injection is considerably reduced so that the phase locked loop stabilizes quickly.

As a further advantage, the loop filter may be incorporated in frequency synthesizers. A frequency synthesizer constructed of a phase locked loop containing the improved loop filter is capable of performing as the frequency hopping synthesizer of a multiplexed cell phone system.

The foregoing and additional objects and advantages of the invention, together with the structure characteristic thereof, which were only briefly summarized in the foregoing passages, will become more apparent to those skilled in the art upon reading the detailed description of a preferred embodiment of the invention, which follows in this specification, taken together with the illustrations thereof presented in the accompanying drawings.

DETAILED DESCRIPTION OF THE PREFERRED EMBODIMENTS

Figure 1:
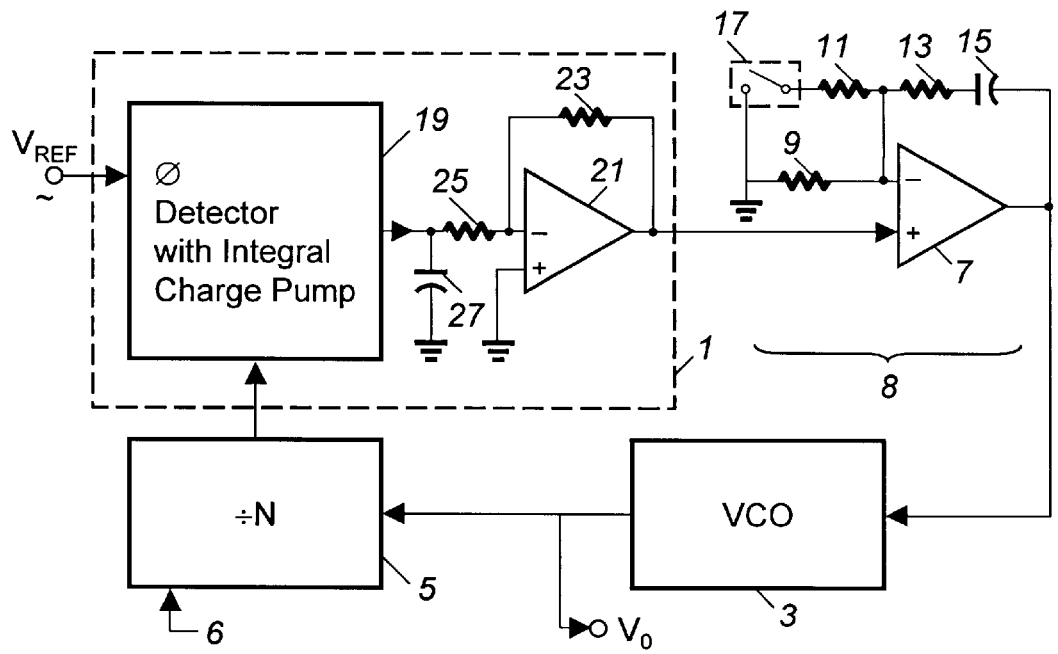
FIG. 1 illustrates a phased locked loop containing the improved loop filter.

FIG. 1, to which reference is made, illustrates a phase locked loop configured as a frequency synthesizer. The phase locked loop includes a phase detector circuit 1, represented in the box formed of dash lines, a voltage controlled oscillator (VCO) 3, and a digitally controlled electronic divider 5 (as example, a modulo 8 divider), sometimes referred to as a frequency divider. The loop filter for the PLL contains operational amplifier 7, resistors 9, 11 and 13, capacitor 15 and an electronic switch 17, the latter of which is controlled by an external source, not illustrated. As is recognized, the inclusion of amplifier 7 makes the loop filter an active one.

Electronic switch 17 may preferably comprise any of the conventional types, such as a field effect transistor (FET) or a high electron mobility transistor (HEMT), which inherently produce less charge injection than CMOS transistors used as switches. When operated to the closed position, the switch connects resistor 11 in shunt of resistor 9 to lower the resistance to ground at the inverting input of the operational amplifier, the effect of which is to broaden the bandwidth of the loop filter while maintaining a constant damping factor. The output of the phase detector 1 (eg. The phase error signal) is input to the non-inverting (+) input of operational amplifier 7 in the loop filter.

In the illustrated embodiment, phase detector 1 is formed of a phase detector chip 19 that includes an integral charge pump, a feature which converts the voltage from the phase detector portion into a current, and a conventional current-to-voltage converter. The latter converter is formed of operational amplifier 21, feedback resistor 23, resistor 25 and capacitor 27. It should be appreciated that if another phase detector chip is selected substituted for phase detector 19, and is one that does not contain the integral charge pump, then the current-to-voltage converter may be omitted. In that substitution, the output of that substitute phase detector chip would connect directly to the non-inverting (+) input of operational amplifier 7 in the loop filter.

Electronic frequency divider may be formed of an electronic counter of conventional design. Such a counter produces an output when the number of pulses (or AC cycles) that is applied to the counter input attains a selected number "N", effectively dividing the input pulses. Divider 5 is digitally controlled by digital codes supplied from an external source to input 6. The digital code sets the divisor, "N" of the divider. The AC signal or pulse train that is output from VCO is divided by divider 5 and produces an input into phase detector 19 that is 1/nth the frequency. The output of VCO 3 also serves as the output $V_0$ of the frequency synthesizer.

Except for the details of loop filter 8, which should be recognized as novel, the frequency synthesizer configuration should be recognized as conventional in structure. When the frequency synthesizer combination is first supplied with DC power, not illustrated, and is activated and electronic switch 17 is in its non-conducting (or "open") state, a source of Vref, an AC signal as may be supplied by a crystal oscillator, not illustrated, is applied to an input of phase detector 1. The second input of the phase detector is supplied from the output of the VCO 3, indirectly, through frequency divider 5. The phase difference between those signals is output from phase detector 1 as an error signal voltage that is applied to the input of loop filter 8.

That signal is filtered by the loop filter and is then applied as a control signal to VCO 3. The VCO provides an output to the frequency synthesizer and also feeds back the output signal to the phase detector input through frequency divider 5. The VCO by design operates over a range of frequencies set by the designer and may differ greatly from the frequency of the reference signal. The frequency divider divides the frequency of VCO 3, which, as an example, may be on the order of 900 MHz, to a lower frequency in the range of the reference signal, the latter of which may be between 5 to 10 MHz as an example. As earlier described in the background to this specification, the phase locked loop goes through an acquisition phase. In that phase, the PLL error signal voltage gradually changes, and, hence, the control voltage applied to VCO 3 from loop filter 8 gradually changes, changing the frequency output from the VCO. The foregoing action continues until the voltage and phase at the two inputs to the phase detector are equal and the error signal voltage is zero or some fixed value. At the latter condition the control voltage output from loop filter 8 is zero, and the phase locked loop becomes locked to the reference signal. When locked, the VCO output at V0 is stable, and is the desired base output frequency.

To change the frequency generated by VCO 3, the divisor, N, of electronic divider 5 is changed. The frequency divider is controlled by a digital code applied to the input 6 to the divider. That digital code specifies the number by which the input frequency is to be divided. As example, N may be initially set to 100. Then the number may be changed to 102, as example. When the change in division, hence, frequency is made, the PLL destablizes, and reenters the acquisition mode. That is, the phase detector 1 produces an error signal because the signal input from the frequency divider is no longer equal to and in phase with reference signal, VREF. The circuit action of acquisition and locking is repeated. When again locked, VCO 3 produces a stable output at a the next desired output frequency. By design, because the base frequency of the VCO is known, the digital codes may be precisely correlated to respective frequencies. By such correlation one sets to divisor N to a number that achieves an output at a particular frequency from the VCO.

As was earlier described, in order to have the PLL stabilize in the shortest possible interval, loop filter 8 should possess a broad bandwidth in characteristic; and, when stabilized or locked at the new frequency, the loop filter should possess a narrow bandwidth in characteristic, which results in introduction of less electronic noise into the circuit. For that purpose the loop filter is switchable in bandwidth characteristic. With electronic switch 17 open, as illustrated, the resistance from the inverting input to ground is the value of R9. By design the resistance of R9 is such as to provide a broad band characteristic to the loop filter. With electronic switch 17 closed, resistor R11 is placed in parallel with resistor R9, and the effective resistance is (R11×R9)/(R11+R9), thereby reducing the overall resistance between the inverting input and ground. Accordingly, in the foregoing operation, when the digital code at input 6 to frequency divider 5 is changed to change "N" and, hence, change the desired frequency of operation of the PLL, when switching to another frequency, switch 17 is also closed for a predetermined short interval or until an external detector, not illustrated, determines that the frequency is stable and sends the signal to open switch 17.

Diverging briefly, as those skilled in the art appreciate, an alternative to the foregoing resistor and electronic switch arrangement is to connect two resistors in series between the inverting (−) input of the amplifier and ground, and place the electronic switch in shunt of one of those resistors. In such alternative when the electronic switch is operated to its conductive state, that one resistor is shorted out, thereby leaving only the one resistor in the series circuit, thereby reducing the resistance to ground.

The state of electronic switch 17 is controlled by the voltage applied by an external source to a control input, not illustrated, of the switch. When the switch is to be placed into the fully conducting state, the appropriate voltage is applied to that control input. When that voltage is removed from the control input, the electronic switch reverts to the non-conducting state. Typical switching times for such switches at present, both switching on and for switching off, appear to take as little 50–100 ns, very short intervals.

The foregoing description of operation is recognized as being relatively static. In practical applications the action is more dynamic and the PLL in practice must meet stringent demands required by the particular application. With the foregoing switchable bandwidth loop filter, the PLL meets the requirements of high speed switching and fast settling (eg. Locking) and low noise. One such application is in the frequency and time division multiplexing system of the cellular phone system described in the background to this specification. For that application the frequency is stepped from one frequency to another (eg. f1, f2 . . . fN) in a short time interval, of between (and including) one microsecond to ten microseconds. Thus the digital code that is input to frequency divider 5 is changed rapidly through application of a serial train of digital codes, representing different frequencies and those codes are then recycled by the multiplexing equipment, not illustrated, in the base station of the cell phone system. With each application of digital code, a signal is supplied by other external equipment to the control input of electronic switch 17 that causes the switch to close (eg. fully conduct) for a short period, thereby making the loop filter characteristic of broad band, during which time the PLL is settling, and then reopen to again make the characteristic of the loop filter narrow band.

By coupling the phase error signal to the non-inverting input of the operational amplifier in the loop filter, instead of to the inverting input as in the prior PLL frequency synthesizer referred to in the background to the specification; and by changing the bandwidth switching system to require only a single electronic switch, the present invention achieves fast switching, fast settling and low noise, and minimal phase/frequency perturbation. It is found that the foregoing loop filter meets the specification for use in a PLL frequency synthesizer for a multiplexed cell phone system. The phase/frequency perturbation is within the low tolerance set by the cell phone companies, and is less than the prior PLL. The circuit switches in frequency and stabilizes at the new frequency in as low as a microsecond.

Figure 2:
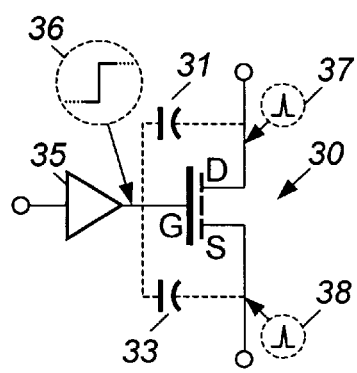
FIG. 2 illustrates a portion of another phased locked loop containing the improved loop filter.

The foregoing circuit reduces the sources of electronic noise caused by charge injection from the electronic switches. Applicants have recognized that each electronic switch inherently contains some parasitic capacitance. Referring to the schematic of FIG. 2 an FET 30 is schematically represented. The FET contains a source, S, gate, G, and drain, D, electrodes. The parasitic capacitance between the gate and drain is represented by capacitor 31, and that between the gate and source is represented by capacitor 33. When the transistor is to be switched into the conducting state, "on", the output of amplifier 35 applies a rapidly rising square wave voltage, represented as 36, to the gate electrode. The voltage applied to the gate functions to cause conduction between the source and drain electrodes. However, some charge, represented as 37, also couples from the gate through parasitic capacitance 31 directly to the drain. And some charge, represented as 38, also couples from the gate through parasitic capacitance 33. Those coupled charges are referred to as charge injections.

In the prior loop filter, one switch was coupled across a series resistance to the inverting input of the operational amplifier. When the switch closed to shunt the resistance, and increase the loop bandwidth, two injected charges were also produced into the circuit, the effect of which is to destablize the locking action of the PLL circuit and produce phase/frequency perturbation. Likewise a second electronic switch was coupled across the feed back resistor of the operational amplifier. When the switch closed (simultaneously with the first electronic switch) to shunt the feed back resistor and maintain a constant damping factor, two additional charges were injected into the feedback circuit of the operational amplifier, creating additional destabilizing effect and phase/frequency perturbation. The destabilizing effect and perturbation results in a PLL that was not of the fast switching or low noise required for the cell phone system.

The new loop filter design eliminates one of the electronic switches, thereby eliminating two sources of injected charges, and producing a superior result. Further, the new loop filter design places the electronic switch in series with a resistor and ground. Thus one of the two injected charges inherent in operation of electronic switch 17 is passed to ground, leaving only a single source of injected charge. By eliminating three of the four sources of injected charge, the new loop circuit provides a superior result. Employing semiconductors that have the least amount of parasitic capacitance for that electronic switch should enhance the performance of the new loop filter even further.

In one specific embodiment of a loop filter having the desired characteristics described, resistor R13 was 1.6K ohms, capacitor 15 was 330 picofarads, resistor R9 was 18K ohms, resistor 11 was 95 ohms, amplifier 7 was an OPA655 model amplifier and electronic switch 17 was a DG213 analog switch. The feedback divider value, N=83, VCO gain=12.5 MHz/V, and phase detector gain=0.34V/rad. The results are: $Fn_1$=37 kHz, z=0.75, $Fn_2$=417 kHz, z=0.75.

Figure 3:
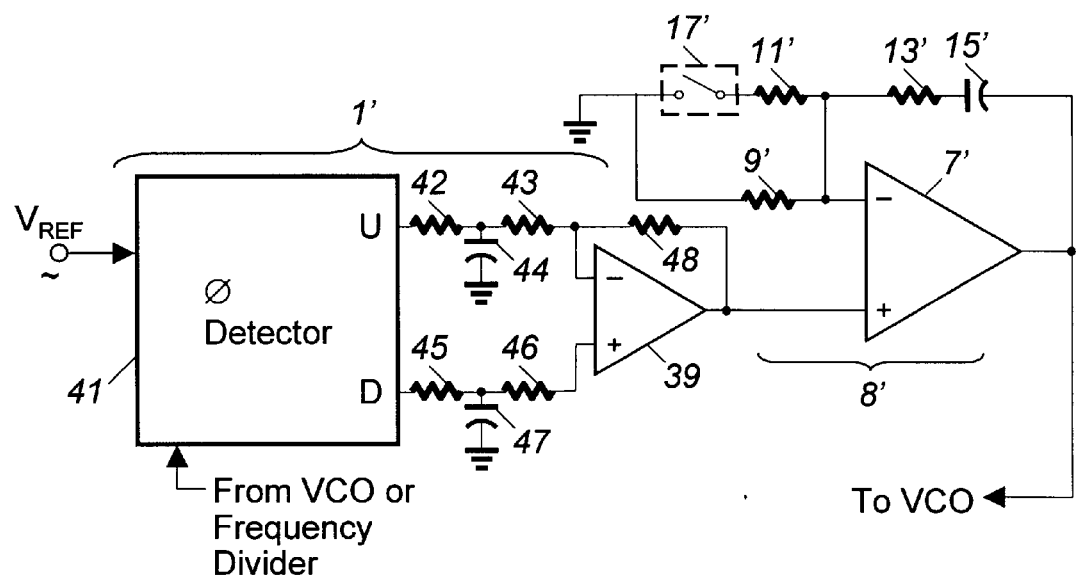
FIG. 3 is a schematic of an electronic switch used in the foregoing embodiments that aids in the description of operation of the invention.
Figure 4:
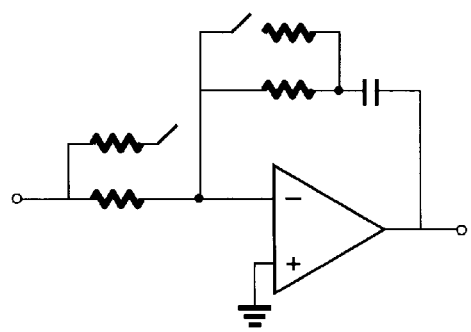
FIG. 4 is a schematic of a prior art loop filter.

Those skilled in the art recognize that the foregoing loop filter arrangement is not dependent upon the details of the phase detector and that any commercially available phase detector chip may be used to produce the phase error voltage, either directly output from the chip, or, as in the embodiment of FIG. 1, indirectly output through a conversion circuit, typically a conversion circuit prescribed by the manufacturer of the phase detector chip. As further example of the versatility of use with phase detector chips, a second embodiment of a PLL that uses the new loop filter is presented in FIG. 2 to which reference is made. For ease of understanding those elements in FIG. 3 that are essentially the same as the elements in the frequency synthesizer of FIG. 1 are identified by the same number primed. Further, the VCO and frequency divider components, which appeared in the prior figure, and may be included in this frequency synthesizer, are not included in the illustration.

As apparent from the figure, the constituent elements of the active loop filter 8' earlier described are included in the PLL, namely, operational amplifier 7', feedback resistor 13' and capacitor 15', resistor 9' and the series connected electronic switch 17' and resistor 11', with the loop filter elements connected as in the embodiment of FIG. 1. The non-inverting (+) input of amplifier 7' is to receive the error signal voltage from the phase detector 1'. Phase detector 1' incorporates a different phase detector chip 41, one that produces two outputs: an up (U) output and a down (D) output Phase detector chip 41 does not contain an integral charge pump. For this type of phase detector a differential amplifier 39 is used to combine the voltages from the U and D outputs to produce the error signal voltage. As in the prior embodiment the output of the phase detector 1' is fed to the non-inverting (+) input of the amplifier in active loop filter 8'.

Amplifier 39 is a differential amplifier. The feed back resistor for the amplifier 48 connects the output of the amplifier to the inverting input (−). The U and D outputs of phase detector 41 respectively connect to the inverting and non-inverting inputs of the amplifier through identical "T" networks, each of which comprise two resistors and a capacitor. Resistors 42 and 43 are connected in series between the inverting input (−) and the U output, and capacitor 44 connects between the junction between those resistors and ground potential. Likewise resistors 45 and 46 are connected in like manner between the non-inverting (+) input of amplifier 39 and the D output of phase detector 41, and capacitor 47 connects between the junction of the foregoing resistors and ground.

The "T" network provides low-pass filtering prior to the active loop filter. This slows down the sharp edges from the phase detector chip. The resistors (42, 43, 45, 46) determine the phase detector gain.

When the U and D outputs of the detector are both positive or negative, the differential amplifier effectively subtracts them by inverting the one signal and adding that signal to the other. When the signals differ in polarity, the differential amplifier effectively amplifies the difference of those signals. The output of amplifier 39 is a singular one that represents the phase error voltage between Vref and the signal presented at the other input to the detector. Assuming the circuit function is the same as in the prior embodiment of FIG. 1 that input is supplied by the output of the frequency divider, not illustrated. The output of loop filter 8' at the output of amplifier 7', which serves as the output of the circuit, is also fed to the input of the foregoing frequency divider, closing the loop.

As is appreciated the relationship and operation of the phase locked loop in the frequency synthesizer is the same as that earlier explained in connection with the operation of the embodiment of FIG. 1, not here repeated. The function and operation of the components of the active band-width switchable loop filter 8' is also the same as before and need not be repeated.

It is believed that the foregoing description of the preferred embodiments of the invention is sufficient in detail to enable one skilled in the art to make and use the invention without undue experimentation. However, it is expressly understood that the detail of the elements comprising the embodiments, presented for the foregoing purpose, is not intended to limit the scope of the invention in any way, in as much as equivalents to those elements and other modifications thereof, all of which come within the scope of the invention, become apparent to those skilled in the art upon reading this specification. Thus, the invention is to be broadly construed within the full scope of the appended claims.

What is claimed is:

1. An active loop filter for a phase locked loop, said active loop filter having an input for receiving a phase error signal, an output for supplying a control voltage, and being switchable in bandwidth characteristic between a narrow bandwidth and a broader bandwidth, comprising at least:

an amplifier, said amplifier having an inverting input, a non-inverting input and an output;

a first resistor and a capacitor, said first resistor and capacitor being connected in electrical series circuit between said inverting input and said output of said amplifier;

a second resistor coupled between said inverting input of said amplifier and electrical ground, said second resistor providing a first predetermined resistance value to ground at said inverting input that enables a narrow bandwidth characteristic to said loop filter;

electronic switch means, said electronic switch means having alternate conductive states, including a first state in which said electronic switch means is non-conducting and a second state in which said electronic switch means conducts fully, and a control input for controlling the conductive state in which said electronic switch means is disposed; and a third resistor, said third resistor being connected in electrical series with said electronic switch between said inverting input of said amplifier and electrical ground in shunt relationship to said second resistor, whereby operation of said electronic switch means to said second state provides a second predetermined resistance value to ground at said inverting input that enables a broader bandwidth characteristic to said loop filter;

said non-inverting input of said amplifier for receiving said phase error signal from said input.

2. The active loop filter as defined in claim 1, wherein said electronic switch means is capable of switching between said first and second states in an interval of time that ranges between 50–100 ns.

3. The active loop filter as defined in claim 1, wherein said electronic switch means comprises a field effect transistor.

4. The active loop filter as defined in claim 1, wherein said electronic switch means comprises a high electron mobility transistor.

5. The active loop filter as defined in claim 1, wherein said electronic switch means comprises a CMOS transistor.

6. A fast switching fast settling phase locked loop comprising at least: phase detector means for receiving a reference signal and a second signal and producing an error output signal that is representative of any phase difference between said second signal and said reference signal;

voltage controlled oscillator means having a control input and an output for producing an output signal of a frequency that is dependent upon the voltage applied to said control input; and an active loop filter, said loop filter being switchable in bandwidth characteristic between a narrow bandwidth and a broader bandwidth;

said active loop filter including:

an operational amplifier, said operational amplifier having an inverting input, a non-inverting input and an output;

a first resistor and a capacitor, said first resistor and capacitor being connected in electrical series circuit between said inverting input and said output of said amplifier;

a second resistor coupled between said inverting input of said amplifier and electrical ground, said second resistor providing a first predetermined resistance value to ground at said inverting input that enables a narrow bandwidth characteristic to said loop filter;

electronic switch means, said electronic switch means having alternate conductive states, including a first state in which said electronic switch means is non-conducting and a second state in which said electronic switch means conducts fully, and a control input for controlling whether said electronic switch means is in said first or second state; and a third resistor, said third resistor being connected in electrical series with said electronic switch between said inverting input of said amplifier and electrical ground in shunt relationship to said second resistor, whereby operation of said electronic switch means to said second state provides a second predetermined resistance value to ground at said inverting input that enables a more broad bandwidth characteristic to said loop filter;

said output of said amplifier being coupled to said control input of said voltage controlled oscillator, whereby the frequency of output signals from said voltage controlled oscillator is a function of said output of said amplifier; and said error output signal being coupled to said non-inverting input of said amplifier.

7. The fast switching fast settling phase locked loop as defined in claim 6, wherein said electronic switch means is capable of switching between said first and second states in a time that ranges between 50–100 ns.

8. The fast switching fast settling phase locked loop as defined in claim 6, wherein said electronic switch means comprises a field effect transistor.

9. The fast switching fast settling phase locked loop as defined in claim 6, wherein said electronic switch means comprises a high electron mobility transistor.

10. The fast switching fast settling phase locked loop as defined in claim 6, wherein said electronic switch means comprises a CMOS transistor.

11. In a phase locked loop circuit, said phase locked loop including a voltage controlled oscillator having an input and an output, a phase detector for receiving a reference voltage of a given frequency and a voltage derived directly or indirectly from said output of said voltage controlled oscillator and providing a phase error output voltage that equals the phase difference between said reference voltage and said voltage derived from said output of said voltage controlled oscillator, when said voltages applied to said phase detector are of the same frequency and that equals the difference in frequency when said voltages applied to said phase detector are of different frequencies; an active loop filter having an input for receiving said output voltage from said phase detector and an output connected to said input of said voltage controlled oscillator, said loop filter having a bandwidth characteristic that is electronically switchable between a first bandwidth characteristic and a second bandwidth characteristic, the improvement wherein said loop filter comprises:
    an operational amplifier, said operational amplifier including an inverting input, a non-inverting input and an output;
    means for coupling said non-inverting input to said phase detector for receiving said phase error output voltage at said non-inverting input;
    resistance means for establishing a resistance to ground at said inverting input of a first predetermined value; and
    electronic switch means for changing the value of said resistance to ground at said inverting input from said first predetermined value to a second predetermined value.

12. A fast switching fast settling phase locked loop comprising at least:
    phase detector means for receiving a reference signal and a second signal and producing an error output signal, said error output signal being representative of any phase difference between said second signal and said reference signal;
    a voltage controlled oscillator having a control input and an output; and
    an active loop filter;
    said active loop filter including:
        an amplifier, said amplifier having an inverting input, a non-inverting input and an output;
        a first resistor and a capacitor, said first resistor and capacitor being connected in electrical series circuit between said inverting input and said output of said amplifier;
        a second resistor coupled between said inverting input of said amplifier and electrical ground;
        electronic switch means, said electronic switch means having alternate conductive states, including a first state in which said electronic switch means is non-conducting and a second state in which said electronic switch means conducts fully, and a control input for controlling whether said electronic switch means is in said first or second state; and
        a third resistor, said third resistor being connected in electrical series with said electronic switch between said inverting input of said amplifier and electrical ground in shunt relationship to said second resistor;
    said output of said amplifier being coupled to said control input of said voltage controlled oscillator; and
    said error output signal being coupled to said non-inverting input of said amplifier.

13. In a frequency and time division multiplexing communication system in which a frequency synthesizer is to produce a sequence of frequencies, f1, f2 . . . fN, in response to a corresponding sequence of digital codes applied to an input of said frequency synthesizer, said frequency synthesizer comprising:
    a phase locked loop circuit, said phase locked loop including
        a voltage controlled oscillator having an input and an output,
        a phase detector for receiving a reference voltage of a given frequency and a voltage derived directly or indirectly from said output of said voltage controlled oscillator and providing a phase error output voltage that equals the phase difference between said reference voltage and said voltage derived from said output of said voltage controlled oscillator, when said voltages applied to said phase detector are of the same frequency and that equals the difference in frequency when said voltages applied to said phase detector are of different frequencies;
        a frequency divider, said frequency divider having an input, an output and a control input for producing an output responsive to attainment of a predetermined count of signals applied to said input, said predetermined count being set by application of a digital code applied to said control input;
        said output of said frequency being coupled to an input of said phase detector;
        an active loop filter having an input for receiving said output voltage from said phase detector and an output connected to said input of said voltage controlled oscillator, said loop filter having a bandwidth characteristic that is electronically switchable between a first bandwidth characteristic and a second bandwidth characteristic, said loop filter further comprising:
            an operational amplifier, said operational amplifier including an inverting input, a non-inverting input and an output;
            means for coupling said non-inverting input to said phase detector for receiving said phase error output voltage at said non-inverting input;
            resistance means for establishing a resistance to ground at said inverting input of said operational amplifier of a first predetermined value; and
            electronic switch means for changing the value of said resistance to ground at said inverting input from said first predetermined value to a second predetermined value when a predetermined control signal is applied to a control input of said electronic switch means;
        means for supplying a reference signal to said phase detector;
        means for applying said sequence of digital codes to said input of said frequency divider wherein each digital code in said sequence is applied to said input of said frequency divider for a predetermined dwell interval; and means for applying said predetermined control signal to said control input of said electronic switch means for a brief interval each time a digital code at said input of said frequency divider is changed, wherein said electronic switch means is placed in a conducting condition for a brief interval, and then is restored to a non-conducting state, said brief interval being shorter in duration than said dwell interval.

14. A bandwidth switchable loop filter for a phase locked loop, comprising:

an operational amplifier having a non-inverting (+) input and an inverting (−) input and an output;

a resistance and capacitance network connected in series between the output of said operational amplifier and said input, with said resistance end of said network connected to said inverting input;

a second resistance, said second resistance connected between said inverting input and ground;

a third resistance;

an electronic switch having first and second switch terminals for opening and closing a circuit between said switch terminals;

said third resistance having one end connected to said inverting input and a remaining end connected to said first switch terminal, whereby closing said switch places said third resistance and said second resistance in parallel circuit between said inverting input and ground to effectively lower the electrical resistance between said inverting input and ground and wherein an electrical charge inherent in said electronic switch is shunted to ground;

said non-inverting input of said operational amplifier for receiving a phase error voltage directly or indirectly from a phase detector of a phase locked loop circuit; and said output of said operational amplifier for providing a voltage to a voltage controlled oscillator of said phase locked loop circuit.

* * * * *